United States Patent [19]

Zertani et al.

[11] Patent Number: 5,049,479

[45] Date of Patent: Sep. 17, 1991

[54] PHOTOPOLYMERIZABLE MIXTURE AND RECORDING MATERIAL PRODUCED THEREFROM

[75] Inventors: Rudolf Zertani, Mainz-Bretzenheim; Dieter Mohr, Budenheim, both of Fed. Rep. of Germany

[73] Assignee: Hoechst Aktiengesellschaft, Frankfurt am Main, Fed. Rep. of Germany

[21] Appl. No.: 410,267

[22] Filed: Sep. 21, 1989

[30] Foreign Application Priority Data

Sep. 21, 1988 [DE] Fed. Rep. of Germany ....... 3832032

[51] Int. Cl.$^5$ ..................... G03F 7/031; G03C 1/735
[52] U.S. Cl. .................................. 430/271; 430/281; 430/288; 430/914; 430/915; 430/284; 522/25; 522/26; 522/29
[58] Field of Search ................... 522/29, 25, 26; 430/914, 915, 281, 288, 271

[56] References Cited

U.S. PATENT DOCUMENTS

| | | | |
|---|---|---|---|
| 3,097,096 | 7/1963 | Oster | 96/30 |
| 3,351,603 | 11/1967 | Chen et al. | 522/26 |
| 3,479,185 | 11/1989 | Chambers . | |
| 3,488,269 | 1/1970 | Allen et al. | 204/159.23 |
| 3,523,792 | 8/1970 | Delzenne et al. | 522/26 |
| 3,597,343 | 8/1971 | Delzenne et al. | 204/159.23 |
| 3,717,558 | 2/1973 | McGinniss | 209/159.15 |
| 3,759,807 | 9/1973 | Osborn et al. | 204/159.23 |
| 3,864,133 | 2/1975 | Hisamatsu et al. | 430/284 |
| 4,054,682 | 10/1977 | Kuesters et al. | 427/54 |
| 4,071,424 | 1/1978 | Dart et al. | 204/159.15 |
| 4,495,271 | 1/1985 | Geissler et al. | 522/26 |
| 4,548,891 | 10/1985 | Riediker et al. | 403/203 |
| 4,590,287 | 5/1986 | Riediker et al. | 556/53 |
| 4,707,432 | 11/1987 | Gatechair et al. | 522/29 |
| 4,713,401 | 12/1987 | Riediker et al. | 522/65 |
| 4,855,468 | 8/1989 | Riediker et al. | 556/53 |
| 4,857,437 | 8/1989 | Banks et al. | 430/327 |
| 4,954,414 | 9/1990 | Adair et al. | 430/914 |
| 4,957,946 | 9/1990 | Meier et al. | 430/281 |
| 4,978,604 | 12/1990 | Banks et al. | 430/281 |
| 4,983,498 | 1/1991 | Rode et al. | 430/284 |
| 4,987,056 | 1/1991 | Imahashi et al. | 430/281 |

FOREIGN PATENT DOCUMENTS

| | | | |
|---|---|---|---|
| 109851 | 5/1984 | European Pat. Off. | 522/66 |
| 126712 | 11/1984 | European Pat. Off. | 522/29 |
| 152377 | 8/1985 | European Pat. Off. | 522/29 |
| 211615 | 2/1987 | European Pat. Off. . | |
| 234430 | 9/1987 | European Pat. Off. . | |
| 242330 | 10/1987 | European Pat. Off. . | |
| 243784 | 11/1987 | European Pat. Off. . | |
| 269573 | 6/1988 | European Pat. Off. . | |
| 277915 | 8/1988 | European Pat. Off. . | |
| 3710281 | 10/1988 | Fed. Rep. of Germany . | |

OTHER PUBLICATIONS

Journal of Radiation Curing, Photoinitiated Cationic Polymerization of Epoxides with Iron-arene Complexes, K. Meier et al, pp. 27-31, 1986.
Radiation Chem., Photochem, vol. 85, 1976, 85:54620a; p. 555, Abstract of Japan Kokai 75-129,214.
Patent Abstract, AU—A—71779/87, pp. 7055-7056.

Primary Examiner—Marion E. McCamish
Assistant Examiner—Christopher D. RoDee
Attorney, Agent, or Firm—Foley & Lardner

[57] ABSTRACT

A photopolymerizable mixture is described which comprises a polymeric binder, a free-radically polymerizable compound having at least one polymerizable group, a photoreducible dye, a trihalomethyl compound which can be cleaved by radiation and a metallocene compound as photoinitiators. The mixture is suitable for use in the production of printing plates and photoresists and is characterized by a particularly high photosensitivity, especially in the visible spectral region. The mixture can therefore be used for the production of images, in particular by means of laser radiation in the visible region.

20 Claims, No Drawings

PHOTOPOLYMERIZABLE MIXTURE AND RECORDING MATERIAL PRODUCED THEREFROM

BACKGROUND OF THE INVENTION

The invention relates to a photopolymerizable mixture comprising a polymeric binder, a polymerizable compound, in particular an acrylate or alkacrylate, and a photoinitiator combination.

Photopolymerizable mixtures are known in the art which, in order to increase the photosensitivity, contain certain combinations of photoinitiators and activators, for example combinations of carbonyl group-containing initiators and tertiary amines. Such mixtures with a synergistic action are described, for example, in U.S. Pat. Nos. 3,759,807, 4,054,682 and 4,071,424. A disadvantage of these mixtures which contain low-molecular-weight amines is that they have a relatively short shelf life, since the amines can easily bleed out, in particular from thin layers.

In JP-A 50/129,214, registered on 2 Apr. 1974 under the number 49/36,614, a photopolymerizable mixture is described which contains a tetra(meth)acrylate of a N,N,N',N'-tetrahydroxyalkyl-alkylenediamine as a polymerizable compound. The tetrafunctional compound serves as a cross-linking agent.

It is furthermore known that the free-radical polymerization of ethylenically unsaturated compounds can be initiated by irradiation with visible light in the presence of photoreducible dyes and reducing agents, for example amines (U.S. Pat. No. 3,097,096). However, these initiator combinations are essentially employed only in aqueous solution or in combination with water-soluble binders.

Initiator combinations of photoreducible dyes and other reducing agents are described in U.S. Pat. Nos. 3,597,343 and 3,488,269. Photopolymerizable mixtures which contain exclusively photoreducible dyes as initiators have hitherto not been employed in practice due to their unsatisfactory photosensitivity.

In JP-A 54/151,024 a photopolymerizable mixture is described which contains an initiator combination of a merocyanine dye and a trihalomethyl-substituted s-triazine and is sensitive towards visible light, for example an argon laser. However, the sensitivity of these mixtures towards visible laser light is inadequate for economic utilization.

The earlier German Patent Application P 37 10 281.8 describes photopolymerizable mixtures which contain (meth)acrylates having urethane groups, tertiary amino groups and optionally urea groups in their molecules; polymeric binders; and, as photoinitiators, a combination of a photoreducible dye, a radiation-sensitive trihalomethyl compound and an acridine, phenazine or quinoxaline compound.

U.S. Pat. No. 3,717,558 describes metallocenes formed from elements of the Subgroups IIa to VIIIa in combination with a further photoinitiator having a carboxylic acid chloride group, for use in photopolymerizable recording materials. These initiator combinations are very sensitive to oxygen and susceptible to hydrolysis and are thus less suitable for the production of printing plates and photoresist materials. Further metallocenes and their use as photoinitiators in photopolymerizable mixtures are described in EP-A 119 162, EP-A 122 223 and EP-A 186 626. These metallocenes comprise titanocenes which have a good resistance to air and show a spectral sensitivity ranging from UV light up to visible light. However, they are only sparingly soluble or even insoluble in the solvents customarily used in the coating process. In EP-A 242 330 and EP-A 269 573, photopolymerizable mixtures are moreover described, which contain a photoinitiator composition comprising a titanocene and a liquid photoinitiator of a hydroxyl or aminoacetophenone type. Also in these materials, the achievable photosensitivity for rapid imaging by means of a low-energy and, at the same time, low-cost argon ion laser is insufficient.

SUMMARY OF THE INVENTION

Accordingly, it is an object of the present invention to provide a photopolymerizable mixture which is suitable for use in the production of printing plates yielding long print runs, and in the production of photoresists having, in the hardened state, a high resistance to processing solutions.

Another object of the present invention is to provide a photopolymerizable mixture having high photosensitivity in the near ultraviolet and visible spectral regions.

A further object of the present invention is to provide a photopolymerizable mixture which is suitable for recording with laser beams in the visible region.

In accomplishing the foregoing objectives, there has been provided, in accordance with one aspect of the present invention, a photopolymerizable mixture comprising a polymeric binder, a free-radically polymerizable compound having at least one polymerizable group, a photoreducible dye as a photoinitiator, and additionally as photoinitiators, a trihalomethyl compound which can be cleaved by radiation, and a metallocene compound. In a preferred embodiment, the metallocene compound is formed from an element of Group IVB of the Periodic Table.

In accordance with another aspect of the present invention there is provided a photopolymerizable recording material comprising a support material and a photopolymerizable mixture as described above.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS

The metallocenes which can be used as initiator components are known as such and most of these compounds are also known for use as photoinitiators, example, from U.S. Pat. Nos. 3,717,558 and 4,707,432. Preference is given to metallocenes formed from elements of Group IV B of the Periodic Table, in particular, compounds of titanium and zirconium. Compounds of this type are described in EP-A 119 162, EP-A 122 223, EP-A 186 626, EP-A 242 330, EP-A 255 486, EP-A 256 981, and EP-A 269 573. Of the great number of metallocenes known, in particular titanocenes, compounds of the general formula I are preferred

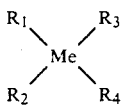

(I)

In this formula

Me denotes a metal atom capable of forming four complex bonds, in particular Ti or Zr, $R^1$ and $R^2$ denote identical or different cyclopentadienyl radicals which may be substituted, and $R^3$ and $R^4$ denote identical or different phenyl radicals which may also be substituted.

The cyclopentadienyl groups may, in particular, be substituted by alkyl radicals having 1 to 4 carbon atoms, chlorine atoms, phenyl or cyclohexyl radicals or may be linked to one another by alkylene groups.

$R^3$ and $R^4$ are preferably phenyl groups which contain at least one fluorine atom in the o-position relative to the bond and may, for the rest, be substituted by halogen atoms, such as F, Cl or Br, alkyl or alkoxy groups having 1 to 4 carbon atoms or a polyoxyalkylene group which may be etherified or esterified. The polyoxyalkylene group comprises, in general, 1 to 6 oxyalkylene units and is preferably in the 4-position of the phenyl radical, and may be etherified or esterified, respectively, by an alkyl or acyl radical having 1 to 18 carbon atoms; it is, in particular, a polyoxyethylene group. Phenyl radicals substituted by 4 or 5 fluorine atoms are particularly preferred. The constituent amount of metallocene compound is, in general, between about 0.01 and 10, preferably 0.05 to 6%, by weight, relative to the nonvolatile components of the mixture.

The mixture according to the invention contains a photoreducible dye as a further photoinitiator component. Suitable dyes are, in particular, xanthene, benzoxanthene, benzothioxanthene, thiazine, pyronine, porphyrine or acridine dyes.

Suitable xanthene and thiazine dyes are described, for example, in earlier German Patent Application P 37 10 281.8, corresponding to U.S. application Ser. No. 07/173,559, the contents of which are hereby incorporated by reference.

Suitable benzoxanthene and benzothioxanthene dyes are described in DE-A 20 25 291 and in earlier German Patent Application P 37 43 457.8, corresponding to U.S. application Ser. No. No. 07/287,276, the contents of which are hereby incorporated by reference.

A suitable porphyrine dye is, for example, hematoporphyrine, and a suitable acridine dye is, for example, acriflavinium chloride hydrochloride. Examples of xanthene dyes are Eosine B (C.I. No. 45 400), Eosine J (C.I. No. 45 380), alcohol-soluble Eosine (C.I. 45 386), Cyanosine (C.I. No. 45 410), Rose Bengal, Erythrosine (C.I. No. 45 430), 2,3,7-trihydroxy-9-phenylxanthen-6-one and Rhodamine 6 G (C.I. No. 45 160).

Examples of thiazine dyes are Thionine (C.I. No. 52 000), Azure A (C.I. No. 52 005) and Azure C (C.I. No. 52 002).

Examples of pyronine dyes are Pyronine B (C.I. No. 45 010) and Pyronine GY (C.I. 45 005).

The amount of photoreducible dye is generally between about 0.01 and 10, preferably between 0.05 and 4%, by weight, relative to the nonvolatile components of the mixture.

In order to increase the photosensitivity, the mixtures according to the invention contain compounds having trihalomethyl groups which can be cleaved photolytically and which are known per se as free-radical-forming photoinitiators for photopolymerizable mixtures. As such coinitiators, compounds containing chlorine and bromine, in particular chlorine, as halogens have proven particularly successful. The trihalomethyl groups can be bound directly to an aromatic carbocyclic or heterocyclic ring or via a conjugated chain. Preferred compounds are those containing a triazine ring in the basic structure, which preferably carries 2 trihalomethyl groups, in particular those which are described in EP-A 137 452, DE-A 27 18 259 and DE-A 22 43 621. These compounds exhibit strong light absorption in the near UV region, at 350-400 nm. Coinitiators are also suitable which absorb only little, or not at all in the spectral region of the copying light, such as trihalomethyltriazines which contain substituents having relatively short mesomerism-capable electron systems or aliphatic substituents. Compounds having another basic structure but which absorb in the shorter-wave UV region, such as phenyl trihalomethyl sulfones or phenyl trihalomethyl ketones, for example phenyl tribromomethyl sulfone, are also suitable.

These halogen compounds are, in general, employed in an amount from about 0.01 to 10, preferably from 0.05 to 4%, by weight, relative to the nonvolatile components of the mixture.

The mixtures according to the invention may contain an acridine, phenazine or quinoxaline compound as a further initiator component. These compounds are known as photo-initiators and are described in DE-C 20 27 467 and DE-C 20 39 861. Due to these compounds, the sensitivity of the mixture is increased, above all in the near ultra-violet region. Suitable representatives of this class of compounds are described in the DE-C mentioned. Examples are 9-substituted acridines, such as 9-phenyl-, 9-p-methoxyphenyl- or 9-acetylaminoacridine, or acridine derivatives containing fused aromatic nuclei, for example benz(a)acridine. A suitable phenazine derivative is, for example, 9,10,-dimethylbenz(a)-phenazine. Suitable quinoxaline derivatives are, in particular, the 2,3-diphenyl derivatives which are preferably further substituted in the two phenyl radicals by methoxy groups. In general, the acridine derivatives are preferred. The amount of this component in the mixture is in the range from about 0 to 10% by weight, preferably between 0.05 and 5% by weight.

If a further increase in the sensitivity of the mixture in the visible spectral region is desired, this can be achieved by adding a compound of the dibenzalacetone or coumarine type. This addition causes higher resolution in the copy and continuous sensitization of the mixture for the visible spectral region up to wavelengths of about 600 nm. Suitable representatives of these compounds are 4,4'-disubstituted dibenzalacetones, for example 4-diethylamino-4'-methoxydibenzalacetone, or coumarine derivatives such as 3-acetyl-7-diethylaminocoumarine, 3-benzimidazolyl-7-diethylaminocoumarine or carbonyl-bis-(7-diethylaminocoumarine). The amount of this compound is in the range from about 0 to 10% by weight, preferably from 0.05 to 4% by weight, relative to the nonvolatile components in the mixture.

The total amount of polymerization initiators is, in general, about 0.05 to 20% by weight, preferably 0.1 to 10% by weight.

Polymerizable compounds suitable for the purposes of the invention are known and described, for example, in U.S. Pat. Nos. 2,760,863 and 3,060,023.

Preferred examples are acrylic and methacrylic esters of dihydric or polyhydric alcohols, such as ethylene glycol diacrylate, polyethylene glycol dimethacrylate, acrylates and methacrylates of trimethylolethane, trimethylolpropane, pentaerythritol and dipentaerythritol and of polyhydric alicyclic alcohols or N-substituted acrylamides and methacrylamides. It is also advantageous to use reaction products of monoisocyanates or diisocyanates with partial esters of polyhydric alcohols. Such monomers are described in DE-A 20 64 079, DE-A 23 61 041 and DE-A 28 22 190.

Particular preference is given to polymerizable compounds which contain at least one photooxidizable group alone or together with one or more urethane groups in the molecule. Suitable photooxidizable groups are in particular amino groups, urea groups, thio groups, which may also be the constituents of heterocyclic rings, and enol groups. Examples of such groups are triethanol-amino, triphenylamino, thiourea, imidazole, oxazole, thiazole, acetylacetonyl, N-phenylglycine and ascorbic acid groups. Polymerizable compounds having primary, secondary and in particular tertiary amino groups are preferred.

Examples of compounds having photooxidizable groups are acrylic and alkacrylic esters of the formula II

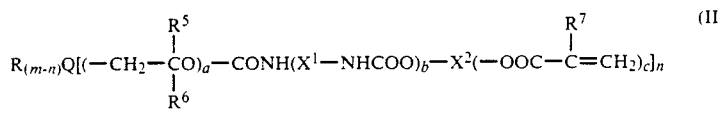

where
Q is

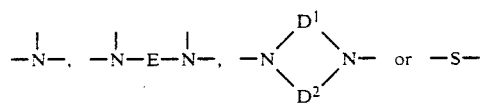

R is an alkyl, hydroxyalkyl or aryl group,
$R^5$ and $R^6$ are each a hydrogen atom, an alkyl group or an alkoxyalkyl group,
$R^7$ is a hydrogen atom or a methyl or ethyl group,
$X^1$ is a saturated hydrocarbon group of 2 to 12 carbon atoms,
$X^2$ is a (c+1)-valent saturated hydrocarbon group in which up to 5 methylene groups may have been replaced by oxygen atoms,
$D^1$ and $D^2$ are each a saturated hydrocarbon group of 1 to 5 carbon atoms,
E is a saturated hydrocarbon group of 2 to 12 carbon atoms, a cycloaliphatic group of 5 to 7 ring members which may contain up to two N, O or S atoms as ring members, an arylene group of 6 to 12 carbon atoms or a heterocyclic aromatic group of 5 or 6 ring members,
a is 0 or an integer from 1 to 4,
b is 0 or 1,
c is an integer from 1 to 3,
m is 2, 3 or 4, depending on the valence of Q, and
n is an integer from 1 to m,
with all the symbols of identical definition being identical to or different from one another.

The compounds of this formula, and the preparation and use thereof are described in detail in earlier German Patent Application P 37 10 279.6, corresponding to U.S. application Ser. No. 07/173,936, the contents of which are hereby incorporated by reference.

If in the compound of the general formula II more than one radical R or more than one radical of the type indicated in square brackets is bonded to the central group Q, these radicals can be different from one another.

Compounds in which all the substituents of Q are polymerizable radicals, i.e. where m is n, are in general preferred.

In general, a is 0 in not more than one radical, and preferably a is 1.

An alkyl or hydroxyalkyl group R generally has 2 to 8, preferably 2 to 4, carbon atoms. An aryl radical R can in general be mononuclear or binuclear, preferably mononuclear, and may be substituted by alkyl or alkoxy groups of up to 5 carbon atoms or by halogen atoms.

Alkyl or alkoxyalkyl groups $R^5$ and $R^6$ can contain 1 to 5 carbon atoms.

$R^7$ is preferably a hydrogen atom or a methyl group, in particular a methyl group.

$X^1$ is preferably a straight-chain or branched aliphatic or cycloaliphatic radical of preferably 4 to 10 carbon atoms.

$X^2$ preferably has 2 to 15 carbon atoms, of which up to 5 may have been replaced by oxygen atoms. In the case of pure carbon chains, generally those having 2 to 12, preferably 2 to 6, carbon atoms are used. $X^2$ can also be a cycloaliphatic group of 5 to 10 carbon atoms, in particular a cyclohexylene group.

$D^1$ and $D^2$ can be identical or different, and together with the two nitrogen atoms form a saturated heterocyclic ring of 5 to 10, preferably 6, ring members.

An alkylene group E preferably has 2 to 6 carbon atoms, and an arylene group E is preferably a phenylene group. Preferred cycloaliphatic groups are cyclohexylene groups and preferred aromatic heterocycles are those having N or S as heteroatoms and 5 or 6 ring members.

The value of c is preferably 1.

The polymerizable compounds of the formula II which contain two urethane groups in every radical (b+1) are prepared by reacting acrylic or alkylacrylic esters which contain free hydroxyl groups in a conventional manner with the same molar amount of diisocyanates and reacting the excess isocyanate group with hydroxylalkylamines, N,N-bishydroxyalkylpiperazines or N,N,N',N'-tetrahydroxyalkylalkylenediamines, in each of which individual hydroxyalkyl groups may have been replaced by alkyl or aryl groups R. If a is 0, the result is a urea grouping. Examples of the hydroxyalkylamine starting materials are triethanolamine, N-alkyl-N,N-di(hydroxyalkyl)amines, diethanolamine, tris-(2-hydroxypropyl)amine and tris-(2-hydroxybutyl)amine.

Examples of the diisocyanate starting materials are hexamethylene diisocyanate, 2,2,4-trimethylhexamethylene di-isocyanate, 1,4-cyclohexylene diisocyanate and 1,1,3-tri-methyl-3-isocyanatomethyl-5-isocyanatocyclohexane.

The hydroxyl-containing esters used are in particular hydroxyethyl methacrylate and hydroxypropyl methacrylate (n or iso) and the corresponding acrylates.

The polymerizable compounds of the formula II where b is 0 are prepared by reacting the above-described hydroxy-alkylamino compounds with isocyanato-containing acrylic or alkylacrylic esters. An isocyanato-containing ester used in particular is isocyanatoethyl (meth)acrylate.

Further suitable compounds having photooxidizable groups are compounds of the formula III

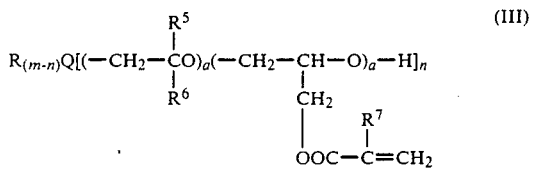

where Q, R, $R^5$, $R^6$, $R^7$, a, m and n are each as defined above and Q can additionally be a group

where E' is a group of the formula IV

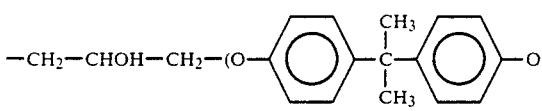

where c has the same meaning as in formula II.

The compounds of the formula III are prepared similarly to those of the formula II, except that the hydroxyalkyl (alk)acrylates are replaced by the corresponding glycidyl (alk)acrylates.

The compounds of this formula and the preparation and use thereof are described in detail in earlier German Patent Application P 37 38 864.9, corresponding to U.S. application Ser. No. 07/270,351, the contents of which are hereby incorporated by reference.

Further suitable compounds having photooxidizable groups are acrylic and alkacrylic esters of the formula V

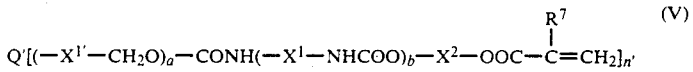

where
Q' is

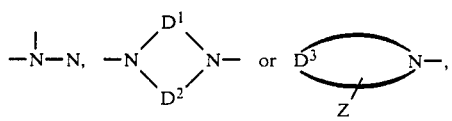

$X^1$ is $C_iH_{2i}$ or

$D^3$ is a saturated hydrocarbon group of 4 to 8 carbon atoms which together with the nitrogen atom forms a 5- or 6-membered ring, Z is a hydrogen atom or a radical of the formula

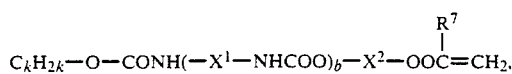

i and k are integers from 1 to 12, n is 1, 2 or 3 depending on the valence of Q', and $R^7$, $X^1$, $X^2$, $D^1$, $D^2$, a and b are each as defined at the formula II, with all the symbols of identical definition being identical or different from one another and, in at least one substituent on the group Q, a being 0.

Of the compounds of the formula V, those which apart from a urea group contain at least one urethane group are preferred. Urea groups are for the purposes of the present invention groups of the formula

where the valences on the nitrogen are saturated by unsubstituted or substituted hydrocarbon radicals. However, it is also possible for one valence on one nitrogen atom to be bonded to a further carbonylamide group (CONH), producing a biuret structure.

The symbol a in the formula V is preferably 0 or 1; i is preferably a number from 2 to 10.

The polymerizable compounds of the formula V are prepared in the same way as the compounds of the formula II.

The compounds of the formula V and the preparation thereof are described in detail in earlier German Patent Application P 38 24 903.0. The proportion of polymerizable compounds in the photopolymerizable layer is in general about 10 to 80, preferably 20 to 60%, by weight, based on the nonvolatile constituents.

Examples of usable binders are chlorinated polyethylene, chlorinated polypropylene, poly(meth)acrylic acid alkyl esters where the alkyl group is for example methyl, ethyl, n-butyl, i-butyl, n-hexyl or 2-ethylhexyl, copolymers of said (meth)acrylic acid alkyl esters with at least one monomer, such as acrylonitrile, vinyl chloride, vinylidene chloride, styrene or butadiene; polyvinyl chloride, vinyl chloride/acrylonitrile copolymers, polyvinylidene chloride, vinylidene chloride/acrylonitrile copolymers, polyvinyl acetate, polyvinyl alcohol, polyacrylonitrile, acrylonitrile/styrene copolymers, acrylonitrile/butadiene/styrene copolymers, polystyrene, polymethylstyrene, polyamides (for example nylon-6), polyurethanes, methylcellulose, ethylcellulose, acetylcellulose, polyvinyl formal and polyvinyl butyral.

Of particular suitability are binders which are insoluble in water, soluble in organic solvents and soluble or at least swellable in aqueous alkaline solutions.

A special mention should be made of carboxyl-containing binders, for example copolymers of (meth)acrylic acid and/or unsaturated homologs thereof, such as crotonic acid, copolymers of maleic anhydride or of the half-esters thereof, reaction products of hydroxyl-containing polymers with dicarboxylic anhydrides, and mixtures thereof.

It is also possible to use reaction products of polymers which carry groups comprising acidic H atoms which have been wholly or partly reacted with activated isocyanates, for example reaction products of hydroxyl-containing polymers with aliphatic or aromatic sulfonyl isocyanates or phosphinic acid isocyanates.

Also suitable are: hydroxyl-containing polymers, for example copolymers of hydroxylalkyl (meth)acrylates, copolymers of allyl alcohol, copolymers of vinyl alcohol, polyurethanes or polyesters, and also epoxy resins, provided they carry a sufficient number of free OH groups or have been modified in such a way that they are soluble in aqueous alkaline solutions, or those polymers which carry aromatically bonded hydroxyl groups, for example condensation products of carbonyl compounds capable of condensation, in particular formaldehyde, acetaldehyde or acetone, with phenols or copolymers of hydroxystyrenes. Moreover, it is also possible to use copolymers of (meth)acrylamide with alkyl (meth)acrylates.

The above-described polymers are suitable in particular when they have a molecular weight between about 500 and 200,000 or higher, preferably between 1,000 and 100,000, and either acid numbers between about 10 and 250, preferably between 20 and 200 or hydroxyl numbers between about 50 and 750, preferably between 100 and 500.

Preferred alkali-soluble binders are:

Copolymers of (meth)acrylic acid with alkyl (meth)acrylates, (meth)acrylonitrile or the like, copolymers of crotonic acid with alkyl (meth)acrylates, (meth)acrylonitrile or the like, copolymers of vinylacetic acid with alkyl (meth)acrylates, copolymers of maleic anhydride with unsubstituted or substituted styrenes, unsaturated hydrocarbons, unsaturated ethers or esters, esterification products of copolymers of maleic anhydride, esterification products of hydroxyl-containing polymers with anhydrides of di- or polycarboxylic acids, copolymers of hydroxyalkyl (meth)acrylates with alkyl (meth)acrylates, (meth)acrylonitrile or the like, copolymers of allyl alcohol with unsubstituted or substituted styrenes, copolymers of vinyl alcohol with alkyl (meth)acrylates or other polymerizable unsaturated compounds, polyurethanes, provided they have a sufficient number of free OH groups, epoxy resins, polyesters, partially hydrolyzed vinyl acetate copolymers, polyvinyl acetals having free OH groups, copolymers of hydroxystyrenes with alkyl (meth)acrylates or the like, phenol-formaldehyde resins, for example novolaks.

The amount of binder in the photosensitive layer is in general about 20 to 90, preferably 40 to 80, % by weight.

The photopolymerizable layers may contain various substances as additives depending on the intended use and the desired properties. Examples are: inhibitors for preventing thermal polymerization of the monomers, hydrogen donors, dyes, colored and uncolored pigments, color-forming components, indicators, plasticizers and chain transfer agents. These constituents are expediently selected in such a way that they absorb as little as possible of the actinic radiation important for the process of initiation.

For the purposes of the present invention, actinic radiation is any radiation whose energy is at least equal to that of visible light. It is possible to use in particular visible light and long-wave UV radiation, but also short-wave UV radiation, laser light, electron beams and X-rays. The light sensitivity ranges from about 300 nm to 700 nm and hence covers a very wide range.

As a result of the combination of photoreducible dyes with photolytically cleavable halogen compounds and metallocenes, a synergistically acting initiator system is obtained whose activity in photopolymerizable mixtures is superior to the known photoinitiator combinations, in particular in the long-wave spectral region at or above 455 nm. Particularly high photosensitivities are obtained in combination with polymerizable compounds containing photo-oxidizable groups. By substituting the above-described metallocene compounds for acridine, phenazine or quinoxaline compounds which are described for use as co-initiators in otherwise identical photopolymerizable mixtures, for example in earlier German Patent Application P 37 10 281.8 or by additionally using the metallocenes together with the polynuclear heterocycles mentioned, mixtures of a considerably higher photosensitivity are obtained. Even compared with mixtures comprising known metallocene-containing initiator combinations, the mixtures according to this invention show a notably higher photosensitivity.

Suitable applications for the material according to the invention are: recording layers for the photomechanical production of printing plates for letterpress printing, planographic printing, intaglio printing and screen printing, relief copies, for example production of texts in braille, individual copies, tanned images, pigment images, etc. The mixtures can also be used for the photomechanical production of etch resists, for example for fabricating name tags or printed circuits and for chemical milling. The mixtures according to the invention are particularly important as recording layers for the production of planographic printing plates and for photoresist technology.

Suitable support materials for the recording material according to the invention are, for example, aluminum, steel, zinc and copper foils, plastics films, for example polyethylene terephthalate or cellulose acetate films, and support materials for screen printing, such as Perlon gauze. It is in many cases advantageous to subject the surface of the support material to a pretreatment (chemical or mechanical) with the aim of correctly adjusting the adhesion of the layer, improving the lithographic properties of the surface of the support material, or reducing the reflectivity of the support material in the actinic region of the copying layer (anti-halation).

The photosensitive materials are fabricated in a conventional manner. For instance, it is possible to take up the layer constituents in a solvent, to apply the solution or dispersion to the intended support material by casting, spraying, dipping, roller coating and the like, and then to dry.

Owing to the broad spectral sensitivity of the recording material according to the invention, it is possible to use any light source familiar to those skilled in the art, for example fluorescent tubes, pulsed xenon lamps, metal-halide-doped high-pressure mercury vapor lamps and carbon arc lamps. In addition, it is possible to expose the photosensitive mixtures according to the invention in conventional projection and magnification equipment with the light from metal filament lamps and by contact exposure with customary incandescent lamps. Exposure can also be effected with the coherent light of a laser. Suitable for the purposes of the present invention are lasers of appropriate power, for example argon ion, krypton ion, dye, helium-cadmium and helium-neon lasers, which emit in particular in the range from 250 to 650 nm. The laser beam can be controlled by means of a preprogrammed linewise scanning movement.

It is generally favorable to keep the mixture away from the influence of atmospheric oxygen during the photopolymerization. When the mixture is used in the form of thin copying layers, it is advisable to apply a suitable protective film which is impermeable to oxygen. This film can be self-supporting and can be peeled off before development of the copying layer. For this purpose, polyester films, for example, are suitable. The protective film can also comprise a material which dissolves in the developer liquid or can be removed during development, at least from the non-hardened areas. Materials which are suitable for this purpose are, for example, polyvinyl alcohol, polyphosphates, sugars etc. Such protective layers generally have a thickness of about 0.1 to 10 $\mu$m, preferably of 1 to 5, $\mu$m.

The materials are further processed in a conventional manner. To effect better crosslinking in the layers, it is possible to heat after exposure. To develop the materials, they are treated with a suitable developer solution, for example with organic solvents, but preferably with a weakly alkaline aqueous solution, which serves to remove the unexposed areas of the layer, leaving behind the exposed areas of the copying layer on the support material. The developer solutions may contain a small amount, preferably less than 5% by weight, of water-miscible organic solvents. They may further contain wetting agents, dyes, salts and other additives. In the course of development, the entire cover layer is removed together with the unexposed areas of the photopolymerizable layer.

Below, the invention is described in detail with reference to illustrative embodiments. Parts by weight (PW) bear the same relation to parts by volume (PV) as the g to the cm$^3$. Percentages and mixing ratios are by weight, unless otherwise stated.

EXAMPLE 1

Comparative Example

Electrochemically grained and anodically oxidized aluminum which had an oxide layer weight of 3 g/m$^2$ and which had been pretreated with an aqueous solution of polyvinyl-phosphonic acid was used as the layer support material for a printing plate. The support was coated with a solution of the following composition, all operations being carried out under red light:

| | | |
|---|---|---|
| 2.84 | PW | of a 22.3% strength solution in methyl ethyl ketone, of a terpolymer prepared from styrene, n-hexyl methacrylate and methacrylic acid (10:60:30) having an acid number of 190, |
| 1.49 | PW | of trimethylolethane triacrylate, |
| 0.07 | PW | of phenylmethane sulfonyl chloride, and |
| 0.02 | PW | of dicyclopentadienyl titanium dichioride in |
| 11 | PW | of butanone and |
| 11 | PW | of butyl acetate. |

Application took place by spin-coating in a fashion such that a dry weight of 2.4 to 2.8 g/m$^2$ was obtained. The plate was subsequently dried for 2 minutes at 100° C. in a circulating air oven. It was then coated with a 15% strength aqueous solution of polyvinyl alcohol (12% of residual acetyl groups, K value 4). After drying, a protective layer having a weight of 2.5 to 4 g/m$^2$ was obtained. The printing plate obtained was exposed using a 2 kW metal halide lamp at a distance of 110 cm under a 13-step exposure wedge having density increments of 0.15 and on which a silver film of uniform optical density (density 1.4) and uniform absorption over the effective spectral range had additionally been mounted as neutral density filter. After exposure, the plate was heated to 100° C. for one minute. It was subsequently developed in a developer of the following composition:

| | | |
|---|---|---|
| 120 | PW | of sodium metasilicate × 9 H$_2$O, |
| 2.13 | PW | of strontium chloride, |
| 1.2 | PW | of non-ionogenic wetting agent (coconut fat alcohol polyoxyethylene ether containing about 8 oxyethylene units) and |
| 0.12 | PW | of antifoam agent, in |
| 4000 | PW | of demineralized water. |

The plate was inked with a greasy printing ink. The fully crosslinked wedge steps indicated in Table I were obtained.

EXAMPLE 2

Comparative Example

The support material of Example 1 was spin-coated, under the same conditions as in Example 1, with a solution of the following composition, to give a layer weight of 2.5 g/m$^2$:

| | | |
|---|---|---|
| 2.84 | PW | of the terpolymer solution specified in Example 1, |
| 1.4 | PW | of triethylene glycol dimethacrylate, |
| 0.04 | PW | of Orasol Blue (C.I. 50 315), |
| 0.06 | PW | of dicyclopentadienyl-bis-pentafluorophenyl-titanium in |
| 11.0 | PW | of butanone and |
| 11.0 | PW | of butyl acetate. |

The plate was then coated with a layer of polyvinyl alcohol as in Example 1 and was exposed and developed as in that Example. After inking with a greasy printing ink, the fully crosslinked wedge steps indicated in Table 1 were obtained.

EXAMPLE 3

Comparative Example

The support material of Example 1 was spin-coated, under the same conditions as in Example 1, with a solution of the following composition, to give a layer weight of 2.5 g/m$^2$.

| | | |
|---|---|---|
| 2.84 | PW | of a 30% strength solution in butanone of a terpolymer of methyl methacrylate/ethyl acrylate/methacrylic acid (60:25:15), |
| 0.85 | PW | of pentaerythritol triacrylate, |
| 0.02 | PW | of Crystal Violet and |
| 0.02 | PW | of dicyclopentadienyl-bis-pentafluorophenyl-titanium in |

| | | |
|---|---|---|
| 11.0 | PW | of butanone and |
| 11.0 | PW | of propylene glycol monomethyl ether. |

The plate was then coated with a layer of polyvinyl alcohol as in Example 1 and was exposed and developed as in that Example. After inking with a greasy printing ink, the fully crosslinked wedge steps indicated in Table 1 were obtained.

EXAMPLE 4

The support material of Example 1 was spin-coated, under the same conditions as in Example 1, with a solution of the following composition, to give a layer weight of 2.5 g/m²:

| | | |
|---|---|---|
| 2.84 | PW | of the terpolymer solution specified in Example 3, |
| 1.4 | PW | of triethylene glycol dimethacrylate, |
| 0.04 | PW | of Orasol Blue (C.I50 315), |
| 0.04 | PW | of alcohol-soluble Eosine (C.I. 45 386), |
| 0.03 | PW | of 2,4-bis-trichloromethyl-6-(4-styrylphenyl)-s-triazine and |
| 0.06 | PW | of dicyclopentadienyl-bis-pentafluorophenyl-titanium in |
| 11.0 | PW | of butanone and |
| 11.0 | PW | of butyl acetate. |

The plate was then coated with a layer of polyvinyl alcohol as in Example 1 and was exposed and developed as in that Example. After inking with a greasy printing ink, the fully crosslinked wedge steps indicated in Table 1 were obtained.

EXAMPLE 5

The support material of Example 1 was spin-coated, under the same conditions as in Example 1, with a solution of the following composition, to give a layer weight of 2.5 g/m²:

| | | |
|---|---|---|
| 2.84 | PW | of the terpolymer solution specified in Example 3, |
| 0.85 | PW | of pentaerythritol triacrylate |
| 0.02 | PW | of Crystal Violet, |
| 0.04 | PW | of alcohol-soluble Eosine (C.I. 45 386), |
| 0.03 | PW | of 2,4-bis-trichloromethyl-6-(4-styrylphenyl)-s-triazine and |
| 0.02 | PW | of dicyclopentadienyl-bis-pentafluorophenyl-titanium in |
| 11.0 | PW | of butanone and |
| 11.0 | PW | of propylene glycol monomethyl ether. |

The plate was then coated with a layer of polyvinyl alcohol as in Example 1 and was exposed and developed as in that Example. After inking with a greasy printing ink, the fully crosslinked wedge steps indicated in Table 1 were obtained.

EXAMPLE 6

The support material of Example 1 was spin-coated, under the same conditions as in Example 1, with a solution of the following composition, to give a layer weight of 2.5 g/m²:

| | | |
|---|---|---|
| 2.84 | PW | of the terpolymer solution specified in Example 1, |
| 1.4 | PW | of the reaction product obtained from 1 mole of triethanolamine and 3 moles of isocyanatoethyl methacrylate, |
| 0.04 | PW | of Oracol Blue (C.I. 50 315), |
| 0.04 | PW | of alcohol-soluble Eosine (C.I. 45 386), |
| 0.03 | PW | of 2,4-bis-trichloromethyl-6-(4-styrylphenyl)-s-triazine and |
| 0.06 | PW | of dicyclopentadienyl-bis-pentafluorophenyl-titanium in |
| 11.0 | PW | of butanone and |
| 11.0 | PW | of butyl acetate. |

The plate was then coated with a layer of polyvinyl alcohol as in Example 1 and was exposed and developed as in that Example. After inking with a greasy printing ink, the fully crosslinked wedge steps indicated in Table 1 were obtained.

EXAMPLE 7

The support material of Example 1 was spin-coated, under the same conditions as in Example 1, with a solution of the following composition, to give a layer weight of 2.5 g/m²:

| | | |
|---|---|---|
| 2.84 | PW | of the terpolymer solution specified in Example 3, |
| 1.4 | PW | of the reaction product obtained from 1 mole of triethanolamine and 3 moles of isocyanatoethyl methacrylate, |
| 0.02 | PW | of Crystal Violet, |
| 0.04 | PW | of alcohol-soluble Eosine (C.I. 45 386), |
| 0.03 | PW | of 2,4-bis-trichloromethyl-6-(4-styrylphenyl)-s-triazine and |
| 0.06 | PW | of dicyclopentadienyl-bis-pentafluorophenyl-titanium in |
| 11.0 | PW | of butanone and |
| 11.0 | PW | of propylene glycol monomethyl ether. |

The plate was then coated with a layer of polyvinyl alcohol as in Example 1 and was exposed and developed as in that Example. After inking with a greasy printing ink, the fully crosslinked wedge steps indicated in Table 1 were obtained.

TABLE 1

| Example No. | Exposure (seconds) | Neutral Density Filter D = 1.4 | Wedge Steps |
|---|---|---|---|
| 1 (C) | 30 | no | 4–5 |
| 2 (C) | 5 | no | 5–6 |
| 3 (C) | 3 | no | 10 |
| 4 | 1 | no | * |
| 4 | 20 | yes | 7 |
| 5 | 20 | yes | 10 |
| 6 | 20 | yes | 12 |
| 7 | 10 | yes | 11 |

*overexposed (>13 steps)
C = Comparative Example

EXAMPLES 8 to 13

Comparative Examples

The support material of Example 1 was coated, under the same conditions as in Example 1, with solutions of the following compositions to give a layer weight of 2.5 g/m² in each case:

| | | |
|---|---|---|
| 2.84 | PW | of the terpolymer solution specified in Example 1, |
| 1.49 | PW | of a monomer according to Table 2, |
| 0.04 | PW | of alcohol-soluble Eosine (C.I. 45 386), |
| 0.03 | PW | of 2,4-bis-trichloromethyl-6-(4-styrylphenyl)-s-triazine and |
| 0.049 | PW | of 9-phenylacridine in |

-continued

| | | |
|---|---|---|
| 22.0 | PW | of propylene glycol monomethyl ether. |

TABLE 2

| Example No. | Monomers used: |
|---|---|
| 8 | Reaction product obtained from 1 mole of triethanolamine and 3 moles of isocyanatoethyl methacrylate, |
| 9 | Reaction product obtained from 1 mole of N,N'-bis-β-hydroxyethyl-piperidine and 2 moles of isocyanatoethyl methacrylate |
| 10 | Reaction product obtained from 1 mole of triethanolamine and 3 moles of glycidylmethacrylate, |
| 11 | Reaction product obtained from 1 mole of 2,2,4-trimethyl-hexamethylene diisocyanate and 2 moles of 2-hydroxyethyl methacrylate, |
| 12 | Reaction product obtained from 1 mole of hexamethylene diisocyanate with 1 mole of 2-hydroxyethylmethacrylate and 0.33 mole of triethanolamine, |
| 13 | Trimethylolethane triacrylate |

After application of a protective layer of polyvinyl alcohol, the plates were exposed and developed as described in Example 1. In order to test the sensitivity of the printing plates in visible light, a 3 mm thick sharp cut-off glass filter from Messrs. Schott, having a cut-off transmission of 455 nm and a silver film of uniform density (density 1.1) serving as a neutral density filter were mounted on the exposure wedge. The following numbers of fully crosslinked wedge steps were obtained.

TABLE 3

| Example No. | Exposure (seconds) | Wedge Steps |
|---|---|---|
| 8 | 15 | 1 |
| 9 | 15 | 2 |
| 10 | 15 | 2–3 |
| 11 | 20 | 1 |
| 12 | 15 | 2–3 |
| 13 | 15 | —* |

*no image obtained

EXAMPLES 14 to 19

The support material of Example 1 was spin-coated, under the same conditions as in Example 1, with solutions of the following compositions to give a layer weight of 2.5 g/m² in each case:

| | | |
|---|---|---|
| 2.84 | PW | of the terpolymer solution specified in Example 1, |
| 1.49 | PW | of a monomer according to Table 2, |
| 0.04 | PW | of alcohol-soluble Eosine (C.I. 45 386), |
| 0.03 | PW | of 2,4-bis-trichloromethyl-6-(4-styrylphenyl)-s-triazine and |
| 0.01 | PW | of dicyclopentadienyl-bis-pentafluorophenyltitanium in |
| 22.0 | PW | of propylene glycol monomethyl ether. |

After application of protective layers of polyvinyl alcohol, the plates were exposed for 15 seconds and then developed, as described in Example 1. In order to test the sensitivity of the printing plates in visible light, a 3 mm thick sharp cut-off glass filter from Messrs. Schott, having a cut-off transmission of 455 nm and—were indicated—a silver film of uniform density (density 1.1) serving as a neutral filter were mounted on the exposure wedge. The following numbers of fully crosslinked wedge steps were obtained.

TABLE 4

| Example No. | Monomer No. | Neutral Density Filter D = 1.1 | Wedge Steps |
|---|---|---|---|
| 14 | 8 | yes | 8–9 |
| 15 | 9 | yes | 9 |
| 16 | 10 | yes | 7–9 |
| 17 | 11 | yes | 6–7 |
| 18 | 12 | yes | 7–9 |
| 19 | 13 | yes | —* |
| 19 | 13 | no | 3–4 |

*no image obtained

EXAMPLES 20 to 26

The support material of Example 1 was spin-coated, under the same conditions as in Example 1, with solutions of the following compositions, to give a layer weight of 2.5 g/m² in each case:

| | | |
|---|---|---|
| 2.84 | PW | of the terpolymer solution specified in Example 1, |
| 1.49 | PW | of monomer 8 according to Table 2, |
| 0.04 | PW | of alcohol-soluble Eosine (C.I. 45 386), |
| 0.03 | PW | of a halogen compound according to Table 5. |
| 0.01 | PW | of dicyclopentadienyl-bis-pentafluorophenyl-tritanium in |
| 22 | PW | of propylene glycol monomethyl ether, |

After application of protective layers of polyvinyl alcohol the plates were exposed for 15 seconds and then developed, as described in Example 1. Exposure was effected under a neutral density filter (D+1.1) and a sharp cut-off glass filter (455 nm). The following numbers of fully crosslinked wedge steps were obtained:

TABLE 5

| Example No. | Halogen Compound | Wedge Steps |
|---|---|---|
| 20 | 2,4-bis-trichloromethyl-6-(5-methoxy-naphth-1-yl)-s-triazine | 9 |
| 21 | 2,4-bis-trichloromethyl-6-methyl-s-triazine | 9–10 |
| 22 | 2,4-bis-trichloromethyl-6-phenyl-s-triazine | 9–10 |
| 23 | phenyl-tribromomethyl-sulfone | 8 |
| 24 | 2,4,6-tris-trichloromethyl-s-triazine | 8–9 |
| 25 | 2,4-bis-trichloromethyl-6-(biphenylyl)-s-triazine | 9 |
| 26 | 2-(p-trichloromethyl-benzoylmethylene)-3-ethyl-benzothiazoline | 7–8 |

EXAMPLE 27

Comparative Example

The support material of Example 1 was spin-coated, under the same conditions as in Example 1, with a solution of the following composition, to give a layer weight of 2.5 g/m²:

| | | |
|---|---|---|
| 2.84 | PW | of the terpolymer solution specified in Example 1, |
| 1.49 | PW | of monomer 8 according to Table 2, |
| 0.04 | PW | of alcohol-soluble Eosine (C.I. 45 386), |
| 0.01 | PW | of dicyclopentadienyl-bis- |

| | | |
|---|---|---|
| 22 | PW | pentafluorophenyl-titanium in of propylene glycol monomethyl ether. |

After application of a protective layer of polyvinyl alcohol, the plate was exposed for 15 seconds and then developed, as described in Example. Exposure was effected under a neutral density filter (D+1.1) and a sharp cut-off glass filter (455 nm); 6 to 7 fully crosslinked wedge steps were obtained.

EXAMPLE 28

Comparative Example

The support material of Example 1 was spin-coated, under the same conditions as in Example 1, with a solution of the following composition, to give a layer weight of 2.5 g/m²:

| | | |
|---|---|---|
| 2.84 | PW | of the terpolymer solution specified in Example 1, |
| 1.49 | PW | of monomer 8 according to Table 2, |
| 0.01 | PW | of dicyclopentadienyl-bis-pentafluorophenyl-titanium in |
| 22 | PW | of propylene glycol monomethyl ether. |

After application of a protective layer of polyvinyl alcohol, the plate was exposed for 15 seconds and then developed, as described in Example 1. Exposure was effected under a neutral density filter (D+1.1) and a sharp cut-off glass filter (455 nm); 6 to 7 fully crosslinked wedge steps were obtained.

EXAMPLE 29

The coating solution of Example 14 was applied to a biaxially stretched, 35 μm thick polyethylene terephthalate film in such a way that a layer weight of 15 g/m² was obtained after drying. The layer was postbaked for three minutes in a circulating air oven at 100° C. and then laminated at a temperature of 115° C. and at a rate of 1.5 m/s onto a cleaned support material comprising an insulating board provided with a 35 μm thick copper cladding.

The layer was exposed for 30 seconds to the light of a 5 kW metal halide lamp (distance 140 cm) under a sharp cut-off glass filter (455 nm), as described in Example 8, using a wedge step as the original. After peeling off the film, the layer was developed for 20 seconds in a spray processor, using an 0.8% strength sodium carbonate solution; 6 fully crosslinked wedge steps were obtained. The crosslinked layer was resistant to the ferric chloride solution customarily used in p.c. board technology.

EXAMPLE 30

The support material of Example 1 was spin-coated, under the same conditions as in Example 1, with a solution of the following composition, to give a layer weight of 2.5 g/m²:

| | | |
|---|---|---|
| 2.84 | PW | of the terpolymer solution specified in Example 1, |
| 1.49 | PW | of monomer 8 according to Table 2, |
| 0.04 | PW | of alcohol-soluble Eosine (C.I. 45 386), |
| 0.03 | PW | of 2,4-bis-trichloromethyl-6-(4-styrylphenyl)-s-triazine and |
| 0.01 | PW | of dicyclopentadienyl-bis-pentafluorophenyl-zirconium in |
| 11.0 | PW | of butanone and |
| 11.0 | PW | of butyl acetate. |

After application of a protective layer of polyvinyl alcohol, the plate was exposed for 15 seconds and then developed, as described in Example 1. Exposure was effected under a neutral density filter (D+1.1) and a sharp cut-off glass filter (455 nm); 6 to 7 fully crosslinked wedge steps were obtained.

What is claimed is:

1. A photopolymerizable mixture comprising
   a) a polymeric binder,
   b) a free-radically polymerizable compound having at least one polymerizable group,
   c) a photoreducible dye,
   d) a trihalomethyl compound which can be cleaved by radiation and
   e) a metallocene compound.

2. A mixture as claimed in claim 1, wherein said metallocene compound comprises a central metal atom and four ligands having aromatic electron systems.

3. A mixture as claimed in claim 2, wherein said metal atom is an atom of Group IV B of the Periodic Table.

4. A mixture as claimed in claim 3, wherein said metal atom is a titanium or zirconium atom.

5. A mixture as claimed in claim 2, wherein two of said ligands are unsubstituted or substituted cyclopentadienyl radicals.

6. A mixture as claimed in claim 2, wherein two of said ligands are phenyl radicals which may be substituted by halogen atoms or by polyoxyalkylene radicals.

7. A mixture as claimed in claim 6, wherein said halogen atoms are fluorine atoms.

8. A mixture as claimed in claim 1, wherein said free-radically polymerizable compound is an acrylic or alkacrylic ester having at least one group which is photooxidizable upon exposure in the presence of the photoreducible dye.

9. A mixture as claimed in claim 8, wherein said photooxidizable group is an amino, urea, thio or enol group.

10. A mixture as claimed in claim 1, wherein said photoreducible dye is a xanthene, thiazine, pyronine, porphyrine or acridine dye.

11. A mixture as claimed in claim 1, wherein said trihalomethyl compound which can be cleaved by radiation is an s-triazine which is substituted by at least one trihalomethyl group and optionally a further group or is an aryl trihalomethylsulfone.

12. A mixture as claimed in claim 1, further comprising an acridine, phenazine or quinoxaline compound as a photoinitiator.

13. A mixture as claimed in claim 1, wherein said binder is insoluble in water and soluble in aqueous-alkaline solutions.

14. A mixture as claimed in claim 1, which comprises from about 10 to 80% by weight of polymerizable compound, from about 20 to 90% by weight of polymeric binder and from about 0.05 to 20% by weight, of radiation-activatable polymerization initiators, based on the non-volatile constituents of the mixture.

15. A photopolymerizable recording material comprising a support material and a photopolymerizable layer which comprises a mixture as claimed in claim 1.

16. A recording material as claimed in claim 15, wherein the photopolymerizable layer is provided with a further transparent layer which is substantially impermeable to atmospheric oxygen and is soluble in a developer liquid used for the photopolymerizable layer.

17. A mixture as claimed in claim 1, wherein said trihalomethyl compound which can be cleaved by radiation is a trichloromethyl compound or a tribromomethyl compound.

18. A mixture as claimed in claim 1, consisting essentially of the recited components.

19. A mixture as claimed in claim 4, consisting essentially of the recited components.

20. A mixture as claimed in claim 17, consisting essentially of the recited components.

* * * * *